(12) United States Patent
Sullivan et al.

(10) Patent No.: US 8,760,135 B2
(45) Date of Patent: Jun. 24, 2014

(54) HIGH-EFFICIENCY BASE-DRIVER CIRCUIT FOR POWER BIPOLAR JUNCTION TRANSISTORS

(71) Applicant: The Trustees of Dartmouth College, Hanover, NH (US)

(72) Inventors: Charles R. Sullivan, West Lebanon, NH (US); Michael Teroerde, Varel (DE)

(73) Assignee: The Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 13/781,510

(22) Filed: Feb. 28, 2013

(65) Prior Publication Data

US 2013/0176010 A1      Jul. 11, 2013

Related U.S. Application Data

(63) Continuation of application No. PCT/US2011/049799, filed on Aug. 30, 2011.

(60) Provisional application No. 61/378,109, filed on Aug. 30, 2010.

(51) Int. Cl.
   *G05F 1/56*        (2006.01)
(52) U.S. Cl.
   USPC .......................................... 323/282
(58) Field of Classification Search
   USPC ............. 323/282, 283, 284; 363/21.02, 21.05
   See application file for complete search history.

(56) References Cited

U.S. PATENT DOCUMENTS

| | | | |
|---|---|---|---|
| 4,491,744 A | | 1/1985 | Corey |
| 4,595,974 A | | 6/1986 | Lethellier |
| 4,672,524 A | * | 6/1987 | Toriyama et al. .......... 363/56.03 |
| 5,465,188 A | * | 11/1995 | Pryor et al. .................... 361/18 |
| 7,961,484 B2 | * | 6/2011 | Lalithambika et al. ..... 363/56.09 |
| 8,049,481 B2 | * | 11/2011 | Li et al. ......................... 323/283 |
| 8,289,732 B2 | * | 10/2012 | Li et al. ..................... 363/21.12 |
| 8,411,468 B2 | * | 4/2013 | Lalithambika et al. .... 363/21.02 |
| 2002/0118503 A1 | | 8/2002 | Gruening et al. |
| 2007/0252442 A1 | | 11/2007 | Jacobson |

OTHER PUBLICATIONS

PCT/US2011/049799 International Search Report and Written Opinion, Apr. 18, 2012, 10 pages.

* cited by examiner

*Primary Examiner* — Adolf Berhane
(74) *Attorney, Agent, or Firm* — Lathrop & Gage LLP

(57) ABSTRACT

A system or module has a 3-or-more layer current-controlled switching device, such as a bipolar power transistor, for driving a load and a base driver circuit coupled to drive it. The driver has a buck-converter configuration for efficiently driving the switching device. In an embodiment, the driver has an inductor, the inductor having a first terminal coupled to a base of the bipolar junction transistor, a high-side switching device coupled to drive a second terminal of the inductor; and a rectification device coupled to the second terminal of the inductor. The driver also has a control circuit for providing a sequence of pulses through the high-side switching device when a control signal indicates the bipolar junction transistor is to be turned on.

10 Claims, 8 Drawing Sheets

HIGH-EFFICIENCY BASE-DRIVER CIRCUIT FOR POWER BIPOLAR JUNCTION TRANSISTORS

RELATED APPLICATIONS

This application is a continuation of International Application No. PCT/US2011/049799 filed Aug. 30, 2011, which claims the benefit of priority of Provisional Application Ser. No. 61/378,109 filed Aug. 30, 2010, both of which are hereby incorporated by reference.

FIELD

The present document relates to circuitry for efficiently driving base terminals of high-power bipolar junction transistors when switching these devices between ON and OFF states.

BACKGROUND

Bipolar transistors are well known in electronics, having been invented over half a century ago. They typically have at least three terminals, a base, an emitter, and a collector.

Consider an NPN bipolar transistor T1, having a grounded emitter E, as illustrated in FIG. 1.

To turn the transistor ON, a current is applied to the base B of the transistor, in this PRIOR ART example the current is applied through resistor R1 by driving a circuit input IN1 to a predefined positive voltage level. The transistor T1 will then conduct a current from its collector C to its emitter E of up to a ratio Beta times the current flowing from base B to emitter E. Beta is a device- and operating-condition-dependent parameter subject to process variations; typically circuits are designed to operate with devices having a range of Beta ratios to ease manufacture.

It is well known that collector C voltage may be significantly less than base B voltage at some, but not all, collector currents, hence collector voltage is not limited to be more than a junction drop above the emitter voltage. Some other devices known in the art, such as insulated-gate bipolar transistors or bipolar darlington-pair 50 devices (FIG. 2), typically have higher minimum output (or collector) voltages, which may result in undesirable power losses in some circuits when conducting large currents. It is known, for example, that a darlington-pair 50 has a minimum collector 52 voltage of a base-emitter diode drop plus a collector-emitter drop, or about 0.9 volts for silicon bipolar devices. There are circuits where the lower collector-emitter voltage drop of bipolar junction transistors offers significant advantage in a system.

It is also apparent in the circuit of FIG. 1 that power is dissipated in the driving resistor R1.

It is also known that a space-charge builds up in the base-emitter junction of bipolar transistors, and to turn off a transistor this charge must be dissipated. Further, to turn the transistor on, a certain amount of space charge must be injected into the base.

In this document, reference will be made to NPN transistors, typically operating with voltages on base and collector that are positive relative to the emitter. Everything stated herein is also applicable to PNP transistors, however base and collector voltages are negative relative to the emitter for PNP transistors.

Buck converters are known in the art of power supply circuitry. These typically provide a high-efficiency voltage reduction, and current increase, between an input voltage terminal and an output terminal. In a typical personal computer, for example, a buck converter is typically used to convert an input power supply voltage of 5 or 12 volts to a local processor power supply voltage of less than 2.5 volts for use by a central processor unit (CPU) chip. Buck converters are typically operated under feedback control to maintain the output terminal near a predetermined voltage.

SUMMARY

A system or module has a 3-or-more layer current-controlled switching device, such as a bipolar power transistor, for driving a load and a base driver circuit coupled to drive it. The driver has a buck-converter configuration for efficiently driving the switching device. In an embodiment, the driver has an inductor, the inductor having a first terminal coupled to a base of the bipolar junction transistor, a high-side switching device coupled to drive a second terminal of the inductor; and a rectification device coupled to the second terminal of the inductor. The driver also has a control circuit for providing a sequence of pulses through the high-side switching device when a control signal indicates the bipolar junction transistor is to be turned on.

DETAILED DESCRIPTION OF THE EMBODIMENTS

Figure 3:
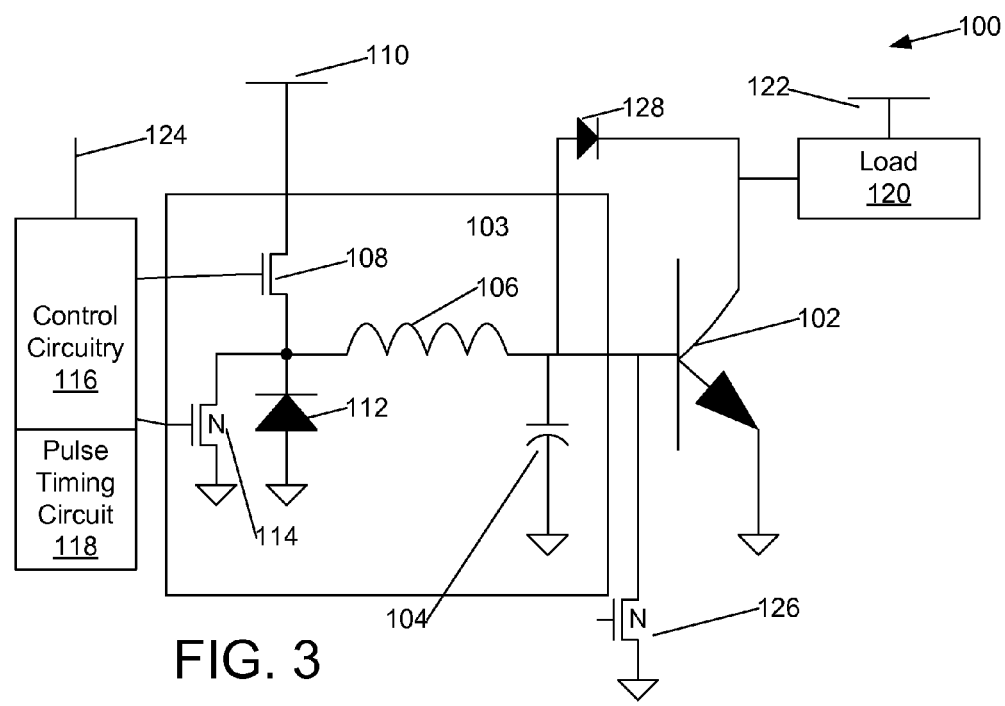
FIG. 3 illustrates use of a buck converter to drive a base of a bipolar junction transistors

In the circuit 100 of FIG. 3, a bipolar switching transistor 102 has a base connected to an output of a buck converter 103. The buck converter 103 has a capacitor 104 and inductor 106. Inductor 106 couples through a switching device 108, in the example of FIG. 3 switching device 108 is a field effect transistor but could be a bipolar transistor or other suitable device, to a power supply 110. Inductor 106 also couples through a second device, which in an embodiment may be a diode 112, and in an alternative embodiment may be an additional switching device 114, to ground. Converter 103 is controlled by control logic 116, which incorporates pulse timing circuit 118. Control logic 116 is controlled in part by a control input 124, which provides a signal indicative of whether it is desirable for switching device 102 to be ON or OFF.

Figure 1:
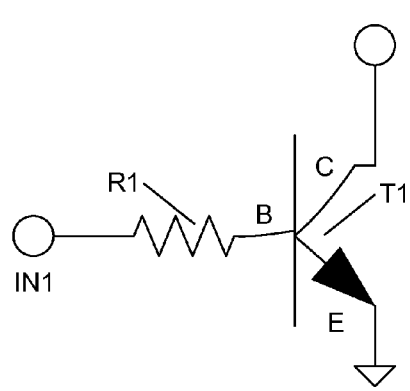
FIG. 1 illustrates prior resistively-limited base drive for bipolar junction transistors.
Figure 2:
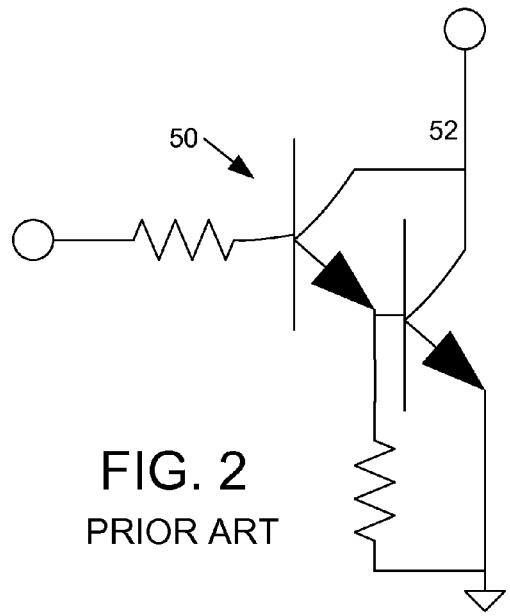
FIG. 2 illustrates prior darlington-pair base drive for bipolar junction transistors.

Switching device 102 has its emitter and collector coupled in series with a power supply and a load. Switching device 102 may be coupled to the load in a high-side switch configuration, in a low-side switch or driving-collector configuration, or in other configurations known in the art. Additional circuitry may be coupled between switching device 102 and the final load, such as power transformers and inductors. In the illustration of FIG. 1, a low-side switch configuration is illustrated where switching device 102 has a collector connected through a load 120 to a power supply 122, power supply 122 may be at the same or a different voltage from power supply 110. In many embodiments power supply 122 is a much higher voltage than power supply 110. In many embodiments, a filtering capacitor bypasses one or both power supply 122 and power supply 110 to ground, in the interest of simplicity these capacitors are omitted from the drawings.

In an embodiment, capacitor 104 is not a separate physical capacitor, but represents parasitic capacitance and charge storage of the base-emitter junction of bipolar switching transistor 102. In another embodiment, a small capacitor 104 is provided to supplement charge storage of the base-emitter junction and help prevent transistor 102 from leaving saturation, and prevent transistor 102 from turning off, between pulses of the buck converter 103.

In an alternative embodiment, control logic 116 has feedback from the collector voltage of transistor 102, and is capable of adjusting base drive of transistor 102 to maintain the collector voltage at a desired level to minimize space charge stored in the emitter-base junction of transistor 102. For example, if collector voltage for a silicon transistor 102 is maintained about 0.7 volt, such that it is not in deep saturation, space charge is reduced at the expense of increased power dissipation, and the power transistor 102 can be turned off more quickly than if collector voltage is allowed to drop as low as, for example, 0.2 volts. In this embodiment, speedup diode 128 is not necessary as its function is provided by this feedback through control logic 116.

In yet another embodiment, neither diode 128 nor feedback of collector voltage to control logic 116, and power transistor 102 is driven into deep saturation to minimize power dissipation in transistor 102.

In operation, with reference to FIG. 3 and the timing diagram of 4, it is assumed that buck converter 103, and its switching device 108, have a switching pulse rate that is substantially higher than that of switching device 102.

During times the switching device 102 is to be off, buck converter switching device 108 is held off, and either discharge device 126 or additional switching device 114 maintained ON to keep base voltage of switching device 102 at a low level.

Each time it is desired to turn on device 102, control logic 116 provides a pulse train, such as pulses VPULSE, with each pulse turning on switching device 108, while discharge device 126 is held off. During a turn-on transient state of device 102, which may be a portion of TDchLoad (FIG. 4) control logic 116 may merge several pulses into a longer pulse, while during a steady-state on state of device 102 these pulses are distinctly separated. For simplicity of illustration in FIG. 4, pulses VPULSE are illustrated at a much reduced pulserate. During each pulse, current flows from the base of bipolar power transistor 102 and capacitor 104 through inductor 106 and switching device 108 to power supply 110. After each pulse, switching device 108 is turned off, and switching device 114 may be turned on by controller 116. During this time, current continues to flow through inductor 106 and either diode 112 or switching device 114; in a manner similar to that of buck converters. Diode 112 and/or switching device 114 operate as a rectification device.

Should a further pulse turn off switching device 114 and turn on switching device 108 before current in inductor 106 dies away, the converter 103 is said to be operating in continuous current mode (CCM), when operating in CCM current in inductor 106 may remain considerably higher than the level to which current in inductor 106 can build up to in a single pulse. In discontinuous current mode (DCM) (described hereafter), switching device 114 is turned off when current in inductor 106 reaches zero. Similarly, in continuous current mode, (CCM) switching device 114 is turned off when a following pulse turns on switching device 108. In either DCM or CCM, switching device 114 essentially operates to mimic a low-forward-voltage-drop diode, thereby reducing waste heat generation by a physical diode 112; in some embodiments diode 112 is a parasitic junction diode of switching device 114.

In the embodiments of FIGS. 3, 6, 9, 11 and 12, the buck converter is described as directly coupled to the base of bipolar switching device 102, 250, 402, 454 because no base-current limiting resistor, such as resistor R1, is required.

Should current a further pulse turn on switching device 108 only after current in inductor 106 dies away, the converter 103 is said to be operating in discontinuous current mode DCM. DCM will be discussed later.

To turn the transistor on, charge has to be injected into the base region. High current at turn-on is desirable to have a fast turn-on, but excessive charge increases the turn-off time because the charge has to be pulled out of the transistor by a negative base current. The new high-efficiency base driver can deliver a high current at turn-on and decrease it to a lower current for the on-state time. Using feedback from the collector voltage, the base current can be set to a level providing a specific collector voltage and thereby limiting space charge as herein described.

After sufficient pulses of current through switching device 108 to produce a base-emitter current in switching device 102, switching device 102 begins to conduct and collector-emitter voltage VLoad begins to decrease, after a time TDchLoad, during which device 102 turns on and any capacitance associated with load 120 discharges through device 102, device 102 enters saturation. Once device 102 is saturated, VLoad reaches a minimum level, and average base-emitter current may have built to a higher level than desired; during time TDeepSat this average base-emitter, current is reduced to a minimum sufficient to keep switching device 102 in saturation; this is done as shown by decreasing pulsewidths of the pulse train VPULSE. Once base-emitter current is reduced to a desired level, during time TSat, current is maintained in the inductor and in the base-emitter junction by pulses VPULSE of an appropriate pulsewidth. Base-emitter current is therefore controlled by pulsewidth modulating pulses applied to switching device 108.

In an alternative embodiment, no feedback is taken from the collector of device 102, and the buck-converter is operated open-loop to produce a current sufficient to guarantee that device 102 reaches, and remains in, saturation. Embodiments lacking feedback may have a speedup diode 128, which may be a Schottky or other low voltage drop diode, added to reduce the level of saturation of device 102. However, base current provided by the buck converter and bypassed by this diode represents wasted power, this speedup diode 128 is not necessary in embodiments using feedback from the switching device 108 collector because the level of saturation can be controlled by adjusting buck-converter current to maintain a desired collector voltage. Further, feedback control of saturation level typically reduces system power consumption because converter current is reduced rather than shunted to the emitter.

When it is desired to turn switching device 102 off, pulses to switching device 108 cease and switching device 114 may be kept ON to discharge any charge in capacitor 104 and stored charge in the emitter base junction of bipolar switching device 102.

Since the presence of the inductor 106 causes discharge current to build up slowly at the base terminal of bipolar power transistor 102, an optional fast-discharge device 126 may be provided to expedite turnoff of transistor 102.

Figure 5:
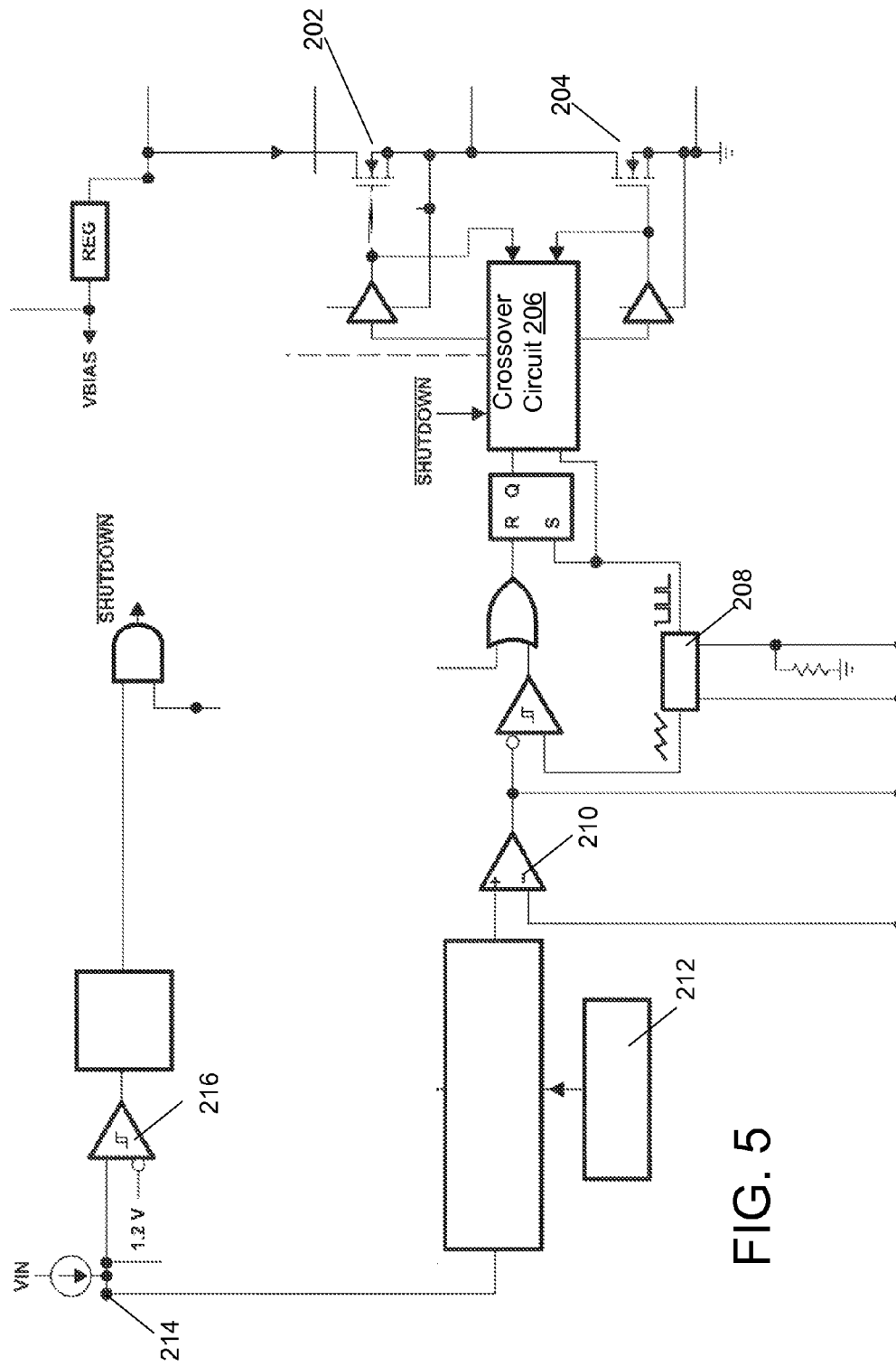
FIG. 5 is a block diagram of portions of a TPS-54317 buck converter integrated circuit.

FIG. 5 illustrates relevant portions of a commercially available Texas Instruments TPS-54317 voltage-regulator buck-converter integrated circuit, as has been used in constructing a functional prototype of the base driver of the present device. This circuit has a pull-up switching device 202 that performs functions similar to those of switching device 108 of FIG. 3. Similarly, it has a pull-down switching device 204 that performs functions similar to those of switching device 114 and diode 112. It should be noted that pull-down switching device 204 of the TPS-54317 incorporates a parasitic diode capable of performing as diode 112 as well as a switching device. Pull-up device 202 and pull-down device 204 are driven through a crossover circuit 206 that prevents turning on both devices 202 and device 204 at the same time. Pulses to pull-up device 202 are generated by circuitry that includes an oscillator 208, oscillator 208 is dependent for timing on an external resistor and capacitor circuit that will not be shown in the interest of simplicity. It also has an error amplifier 210 for comparing a voltage output of a buck converter to a reference voltage, such as may be provided by reference 212, to adjust pulsewidths applied to pull-up device 202. It also has an enable input 214 and an enable signal receiving circuit 216 for receiving a control signal for enabling the circuit. The TPS-54317 also has additional circuitry for thermal protection and delayed initial startup that will be ignored for simplicity.

Figure 6:
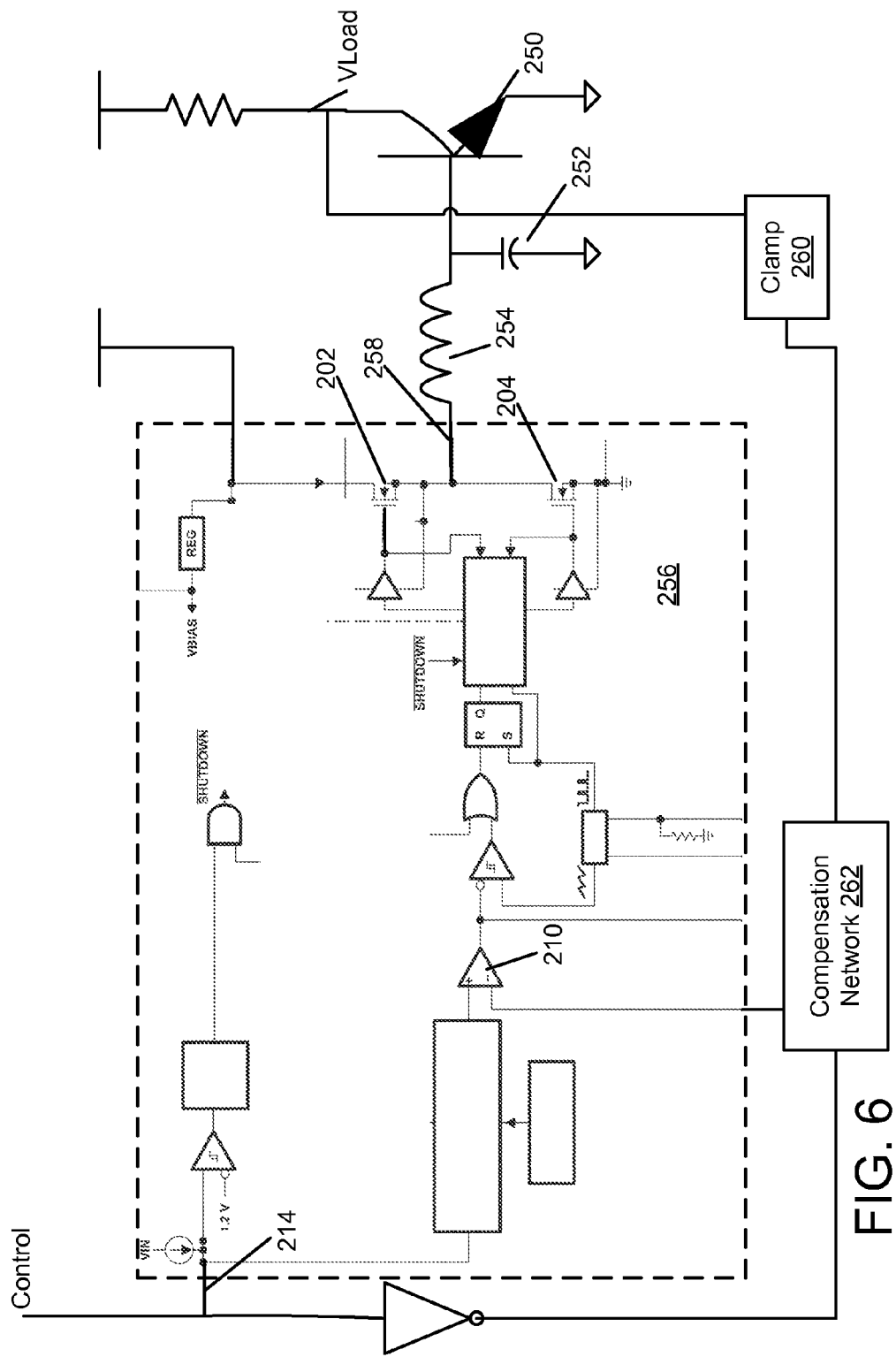
FIG. 6 is a schematic diagram of a prototype embodying a TPS-54317 circuit driving a large power bipolar junction transistor.

In a prototype of the driver circuit using a TPS-54317, as illustrated in FIG. 6, bipolar junction power transistor 250 has its base connected to a capacitor 252 and inductor 254. Inductor 254 is connected to an output terminal 258 of TPS-54317 (256), and a circuit Control input is connected to the enable input 214. A feedback signal taken from a collector of transistor 252 feeds through a voltage-clamp circuit 260 and a compensation network 262 to the error amplifier of the TPS-54317. Compensation network 262 is intended to prevent circuit oscillations, and has resistors and capacitors to reduce error amplifier gain at high frequencies. In an alternative embodiment, compensation network 262 incorporates a voltage divider to a disable signal such that a high voltage is provided to the feedback amplifier input when it is desired to turn off bipolar transistor 250.

Figure 4:
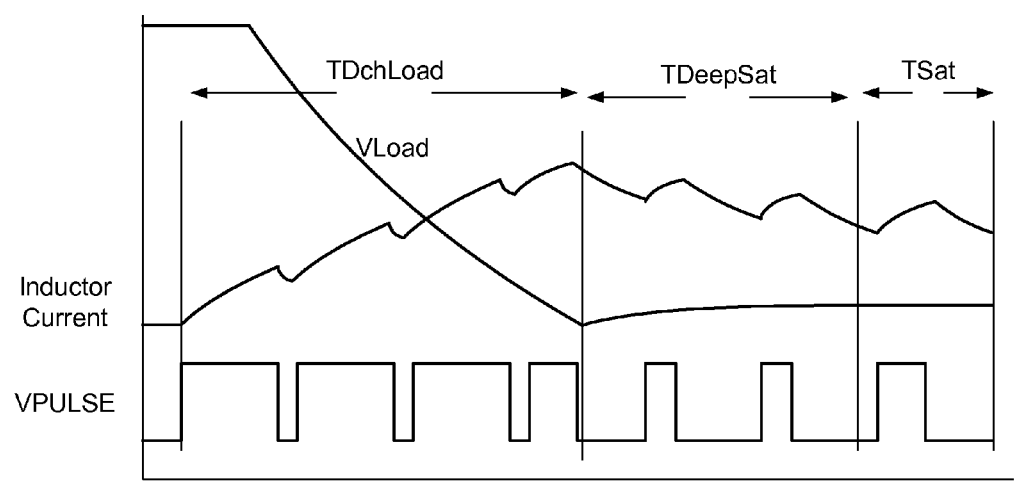
FIG. 4 is a timing diagram of basic operation of the circuit of FIG. 3.

Operation of the circuit of FIG. 6 is similar to that heretofore described with reference to FIG. 3 and FIG. 4. During times the bipolar transistor 250 is desired to be turned off, pull-up device 202 remains off and pull-down device 204 remains on to pass any collector-base leakage current to circuit ground. During times when it is desired to turn on transistor 250, pull-up device 202 provides a sequence of pulses to inductor 254, and between pulses inductor 254 draws additional current from ground through pull-down device 204 to maintain a base current in device 250. Once transistor 250 enters saturation, base current is modulated to maintain transistor 250 in light saturation, as opposed to deep saturation, through feedback When the base driver of the present document is operated in DCM mode, charge stored in capacitor 104 and the emitter-base junction of bipolar switching device 102 can sustain device 102 in conduction for a brief time; after which device 102 may come out of saturation; to prevent device 102 from coming out of saturation, a further pulse to turn on device 108 is provided before stored charge is exhausted. In an alternative embodiment, the driver may operate in CCM during turn-on, and DCM during steady-state operation.

Figure 7:
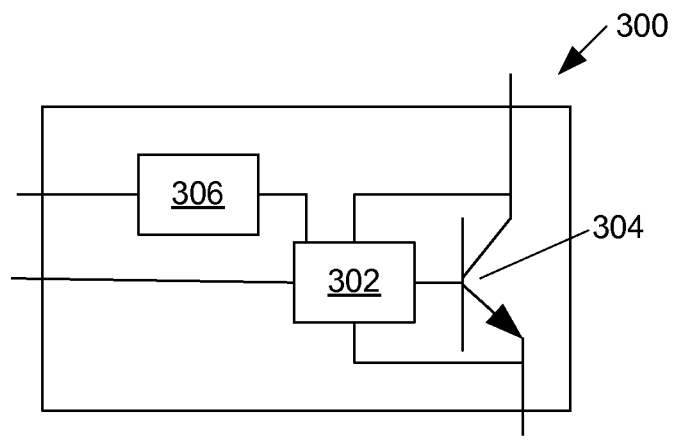
FIG. 7 is a symbolic representation of a module having a bipolar power transistor and a driver incorporating a buck converter.

The present driver 302 circuit may be integrated into a power-switching module 300, as illustrated in FIG. 7, incorporating the power transistor 304 as well as the driver 302. Such modules may optionally incorporate power supply and conditioning circuitry 306 for powering the driver. An alternative embodiment of the power-switching module incorporates a photodetector for receiving optical control signals over an optical fiber to control the driver 302, and thereby control the power transistor 304. Embodiments of such modules may have isolated power supply circuitry 306 to permit high standoff voltages, while other embodiments may have non-isolated power supply circuitry 306.

Figure 8:
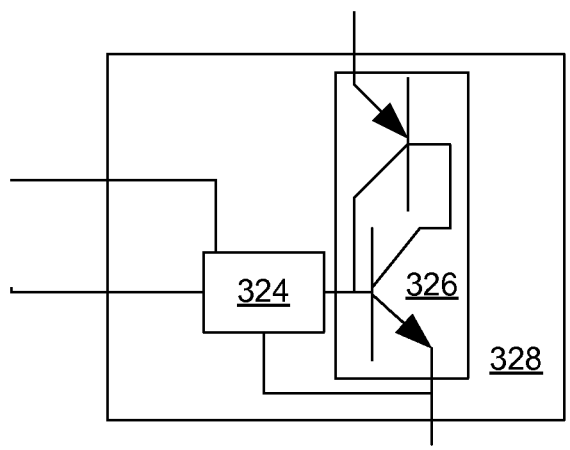
FIG. 8 is a symbolic representation of a module having a thyristor, such as a silicon-controlled rectifier, and a driver incorporating a buck converter.

The present driver circuit 324 may also, as illustrated in FIG. 8, be used to trigger other current-controlled or current-triggered electronic switching devices such as thyristors 326. While bipolar transistors typically have three active layers, thyristors include four-and-more-layer semiconductor devices such as but not limited to silicon-controlled rectifiers (an equivalent circuit of a silicon-controlled rectifier is illustrated in FIG. 8), triacs, and gate-turnoff devices. In an embodiment, the driver circuit 324 is incorporated into a power-switching module 328 with the power thyristor 326 as well as the driver 324.

The present driver circuit may incorporate thermal shutdown and other safety-enhancing circuitry for protecting the driver, such as but not limited to the thermal shutdown circuit embedded in the TPS-54317. Modules, such as modules 300, 328, may also incorporate protective circuitry for protecting the switching transistor 102, 304, or thyristor 326, such as temperature sensing and thermal shutdown circuitry as well as overcurrent detection and shutdown circuitry.

The power transistors 102, 304 and thyristors 326 herein described may be fabricated from any suitable semiconductor material used for bipolar devices, including germanium, silicon, gallium-nitride and silicon-carbide.

Figure 9:
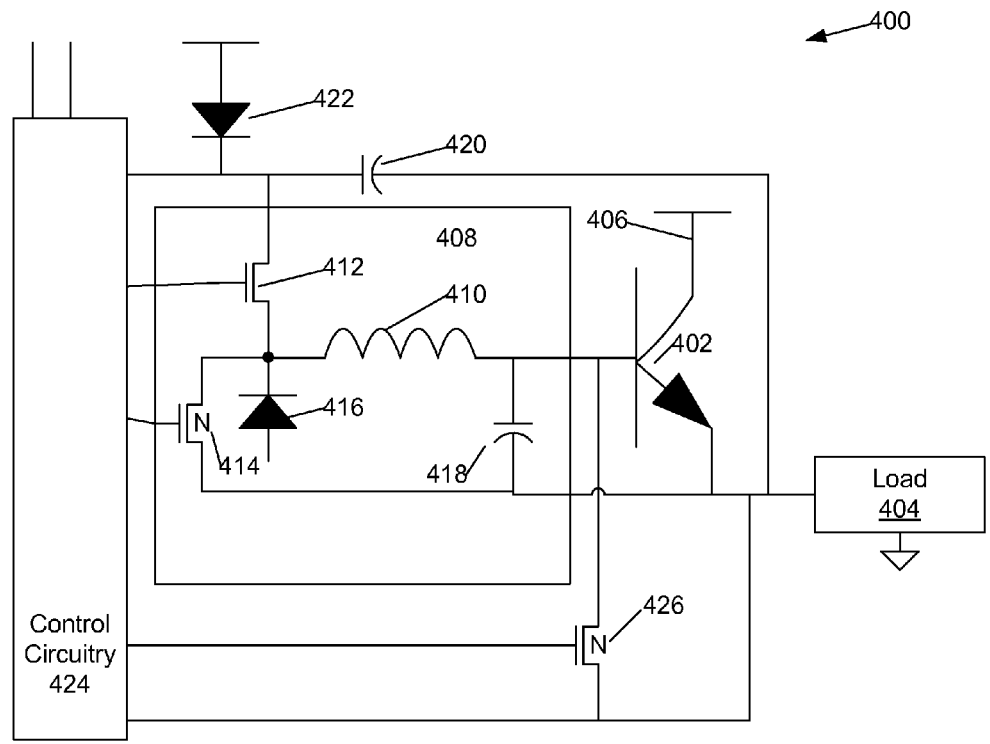
FIG. 9 is a schematic diagram of an embodiment having a bipolar power transistor driving a load in a high-side switch configuration.

An embodiment 400 (FIG. 9) having bipolar power transistor 402 coupled in a high-side switch configuration to drive a load 404 from load power supply 406 and using a bootstrap configuration to power the DC-DC buck converter 408 is illustrated in FIG. 9. In this embodiment, buck converter 408 includes inductor 410 and switching device 412, 414, and diode 416. Capacitor 418 provides filtering on the converter 408 output as converter 408 feeds the base of bipolar transistor 402. The buck converter operates as previously discussed. The buck converter in this embodiment is powered by a bootstrap circuit incorporating capacitor 420 and diode 422, which provides a high voltage sufficient to permit the buck converter 408 to drive transistor 402 for output pulses to the load 404 of width in milliseconds. Operation of control logic 424 and turnoff-acceleration transistor 426 are essentially as previously described and will not be repeated here for simplicity.

Figure 12:
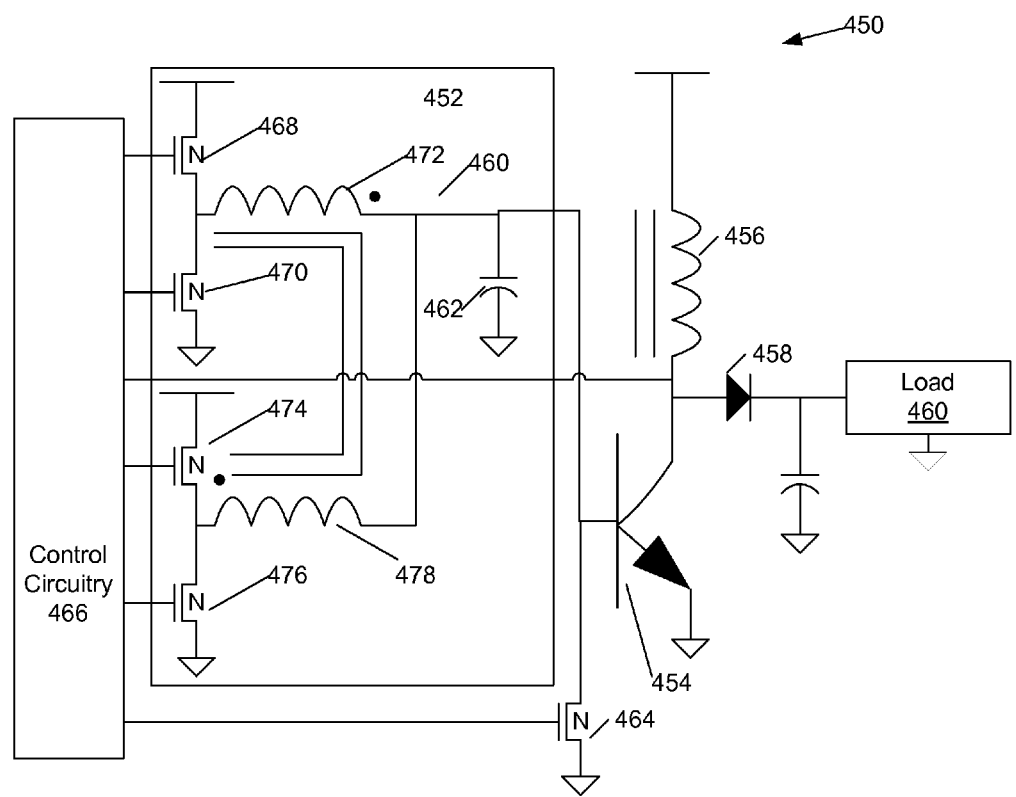
FIG. 12 is a schematic diagram of an embodiment using a boost converter and a bipolar transistor in a low-side switch configuration.

An embodiment 450 having a two-phase coupled-inductor buck converter 452 for driving a base of a large bipolar power transistor 454 is illustrated in FIG. 12. In this embodiment, bipolar power transistor 454 is itself a switching device in a high-power DC-DC converter having an inductor 456 and a diode or diode-configured switching device 458 for driving a load 460. While the high-power DC-DC converter is illustrated as a boost configuration, the large bipolar power transistor 454 may be coupled to serve as a high or low side switch in a buck converter, buck-boost, or other DC-DC or DC-AC converter in alternative embodiments. The two-phase coupled-inductor buck converter 452 is particularly suited to embodiments requiring rapid switching of bipolar transistor 454 because it has the capability to increase or decrease (slew) the total current in the two inductors up or down rapidly (based on the common-mode inductance of the coupled inductor) while maintaining moderate levels of ripple current in the output to transistor 454 and filter capacitor 462, as well as in the inductor windings and the MOSFETS. The two-phase coupled-inductor buck converter 452 has control circuitry 466, a first phase high side switch 468, low-side switch 470, and first phase inductor 472. It also has a second phase high side switch 474, low side switch 476, and second phase inductor 478. It should be noted that integrated controller and switch kits for multiphase coupled-inductor buck converters capable of providing currents of over 100 amperes are available; these kits were originally developed and marketed for providing power to large CMOS processor integrated circuits such as may be found on computer motherboards but may be used as described herein to drive large high-base-current bipolar power transistors.

Other switching DC-DC voltage downconverter architectures may also be applicable to driving bases of switching devices, and integrated DC-DC converter and voltage regulator modules that implement those architectures may also be applied in a similar manner to the single and multiphase buck converters heretofore illustrated in detail. For example, transformer-coupled switching DC-DC converters are often used in power supplies where isolation is desirable, and integrated circuits for use in such converters are readily available. These integrated circuits and a transformer-coupled DC-DC converter based upon them may be adapted to driving a base of a large bipolar power transistor in a manner similar to that herein described, and would be of particular benefit where the large bipolar power transistor serves as a high-side switch.

In the boost converter 452 of this embodiment 450, switching device 456 causes current to build up in inductor 458; when device 456 turns off, continued inductor 458 current flows through diode 460 to charge capacitor 462 and drive the base of transistor 464. Control logic 466 provides pulses to switching device 456 to either drive transistor 464 to an on-state, or uses feedback to drive transistor 464 sufficiently to provide a desired voltage level at load 404, in response to a control signal 468.

The embodiments illustrated herein using DC-DC converters, including buck and boost converters, to drive bipolar transistors, operate with DC-DC converter switching rates in the ultrasonic range greater than the 20 kHz limit of human hearing. Particular embodiments operate with the base-driver buck-converter operating at high frequencies in the 500 kHz to 5 MHz range, and in turn may drive large bipolar switching devices that switch at frequencies in the ultrasonic range. Typically, the large bipolar switching device switches at a frequency one to three orders of magnitude lower than the switching frequency of the DC-DC converter that drives its base.

Figure 10:
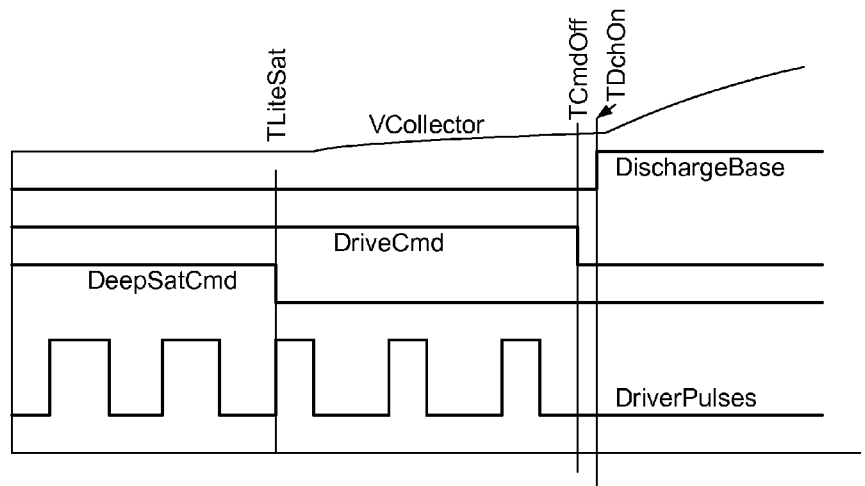
FIG. 10 is a timing diagram illustrating a transition from deep to light saturation before turnoff.
Figure 11:
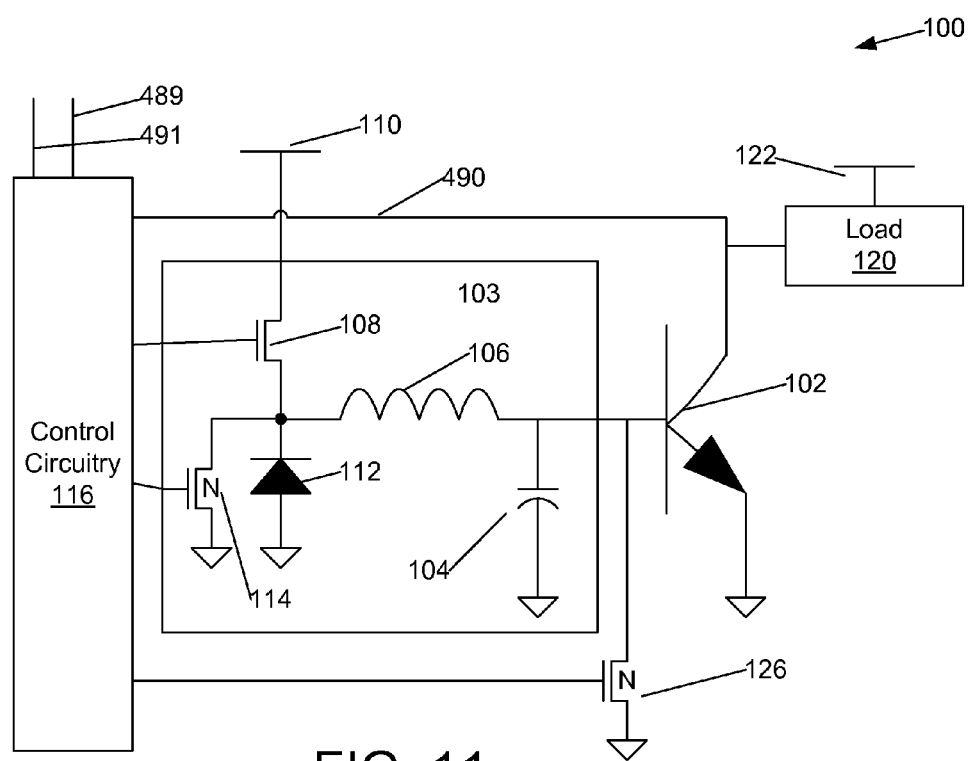
FIG. 11 is a schematic diagram of an embodiment using an early-turnoff signal to come out of deep saturation.

In an alternative, fast turn-off, embodiment, such as is illustrated in FIG. 10, and with reference to FIG. 11, the control circuitry 116 operates as previously described with reference to FIGS. 3 and 4 in providing pulsewidths to switching device 108 during initial turnon of bipolar transistor 102. Once bipolar device 102 is fully on and has entered saturation, bipolar transistor 102 is maintained in deep saturation during a normal operation phase to maintain collector-emitter voltage drop at a minimum level for high efficiency of driving the load. When a control signal DeepSatCmd 489 transitions, at TLiteSat, control circuitry 116 adjusts pulsewidth of drive to switching device 108 to reduce base current of bipolar transistor 102 to allow transistor 102 to come out of deep saturation into light saturation. In order to maintain bipolar transistor 102 in light saturation, where space charge in the base-emitter junction of bipolar transistor 102 is reduced from that present in deep saturation, feedback from bipolar power transistor 102 collector terminal 490 is used to dynamically adjust base current provided by the DC-DC converter 103 to maintain a base current such that bipolar transistor 102 enters and remains in light saturation with a collector voltage greater than that present in deep saturation. When a second control signal DriveCMD 491 transitions at TCmdOff, pulses to device 108 are terminated and turnoff device 126 is activated to remove charge from filter capacitor 104 and remaining space charge from the base-emitter junction of power transistor 102, and thereby turn off power transistor 102.

In an alternative current-controlled embodiment, current provided to the base of bipolar switching device 102 is monitored by control circuitry 116 and used as a feedback signal to control circuitry 116. In this embodiment, pulsewidths of pulses applied by control circuitry 116 to switching device 108 are dynamically adjusted to maintain a predetermined base current in the base of bipolar switching device 102.

Thus, there has been shown and described a novel product associated with driving base-emitter junctions of switching transistors, which fulfills all of the objects and advantages sought therefor. It will be apparent to those skilled in the art, however, that many changes, variations, modifications, and other uses and applications for the subject product are possible, and also changes, variations, modifications, and other uses and applications which do not depart from the spirit and scope of the invention are deemed to be covered by the invention which is limited only by the claims which follow.

What is claimed is:

1. A system having a bipolar junction transistor for driving a load and a base driver circuit coupled to drive a base of the bipolar junction transistor, wherein the base driver circuit comprises:

A DC-DC converter comprising an inductor, the inductor having a first terminal coupled to a base of the bipolar junction transistor, a high-side switching device coupled to drive a second terminal of the inductor; and a rectification device coupled to the second terminal of the inductor; and A control circuit for providing a sequence of pulses through the high-side switching device of the DC-DC converter when a control signal indicates the bipolar junction transistor is to be turned on; the control circuit not providing pulses to the high-side switching device when the control signal indicates the bipolar junction transistor is to be turned off;

the base driver circuit comprising circuitry configured to prevent deep saturation in the bipolar junction transistor prior to turnoff;

wherein the circuitry configured to prevent deep saturation in the bipolar junction transistor prior to turnoff comprises circuitry configured to prevent deep saturation by using feedback from a collector of the bipolar junction transistor to reduce a pulsewidth of the pulses through the high-side switching device when the bipolar junction transistor enters saturation.

2. A system having a bipolar junction transistor for driving a load and a base driver circuit coupled to drive a base of the bipolar junction transistor, wherein the base driver circuit comprises:
   A DC-DC converter comprising an inductor, the inductor having a first terminal coupled to a base of the bipolar junction transistor, a high-side switching device coupled to drive a second terminal of the inductor; and a rectification device coupled to the second terminal of the inductor; and
   A control circuit for providing a sequence of pulses through the high-side switching device of the DC-DC converter when a control signal indicates the bipolar junction transistor is to be turned on; the control circuit not providing pulses to the high side switching device when the control signal indicates the bipolar junction transistor is to be turned off;
   the base driver circuit comprising circuitry configured to prevent deep saturation in the bipolar junction transistor prior to turnoff;
   wherein the circuitry configured to prevent deep saturation in the bipolar junction transistor prior to turnoff comprises circuitry for feedback from a collector of the bipolar junction transistor such that a pulsewidth of the pulses through the high-side switching device is dynamically adjusted to maintain a determined voltage on the collector of the bipolar junction transistor.

3. A system having a bipolar junction transistor for driving a load and a base driver circuit coupled to drive a base of the bipolar junction transistor, wherein the base driver circuit comprises:
   A DC-DC converter comprising an inductor, the inductor having a first terminal coupled to a base of the bipolar junction transistor, a high-side switching device coupled to drive a second terminal of the inductor; and a rectification device coupled to the second terminal of the inductor; and
   A control circuit for providing a sequence of pulses through the high-side switching device of the DC-DC converter when a control signal indicates the bipolar junction transistor is to be turned on; the control circuit not providing pulses to the high side switching device when the control signal indicates the bipolar junction transistor is to be turned off;
   the base driver circuit comprising circuitry configured to prevent deep saturation in the bipolar junction transistor prior to turnoff;
   wherein the circuitry configured to prevent deep saturation in the bipolar junction transistor prior to turnoff comprises a speedup diode coupled between a collector of the bipolar junction transistor and the base of the bipolar junction transistor, the speedup diode conducting current when the bipolar junction transistor is in deep saturation.

4. The system of claim 2 wherein the control circuit, the rectification device, and the high-side switching device are components of a buck-converter integrated circuit.

5. A system having a bipolar junction transistor for driving a load and a base driver circuit coupled to drive a base of the bipolar junction transistor, wherein the base driver circuit comprises:
   A DC-DC converter comprising an inductor, the inductor having a first terminal coupled to a base of the bipolar junction transistor, a high-side switching device coupled to drive a second terminal of the inductor; and a rectification device coupled to the second terminal of the inductor; and
   A control circuit for providing a sequence of pulses through the high-side switching device of the DC-DC converter when a control signal indicates the bipolar junction transistor is to be turned on; the control circuit not providing pulses to the high switching device when the control signal indicates the bipolar junction transistor is to be turned off;
   the base driver circuit comprising circuitry configured to prevent deep saturation in the bipolar junction transistor prior to turnoff;
   the system further comprising a base-turn-off transistor coupled to discharge charge stored in a base-emitter junction of the bipolar junction transistor, wherein the control circuit is operable to drive the bipolar junction transistor into deep saturation during a first interval, and is provided with feedback from a collector of the bipolar junction transistor such that a pulsewidth of the pulses through the high-side switching device is dynamically adjusted to maintain a determined light-saturation voltage on the collector of the bipolar junction transistor during a second interval, and to drive the base-turn-off transistor in a third interval.

6. The system of claim 5 wherein the high-side switching device, the rectification device, and the control circuit are integrated on a single integrated circuit.

7. A system having a bipolar junction transistor for driving a load and a base driver circuit coupled to drive a base of the bipolar junction transistor, wherein the base driver circuit comprises:
   A DC-DC converter coupled to drive a base of the bipolar junction transistor;
   A control circuit for providing pulses for controlling the DC-DC converter, the control circuit operable to enable the DC-DC converter to drive the base of the bipolar junction transistor when a control signal indicates the bipolar junction transistor is to be turned on, and operable to disable the DC-DC converter from driving the base of the bipolar junction transistor when the control signal indicates the bipolar junction transistor is to be turned off;
   wherein the control circuit is provided with feedback from a collector of the bipolar junction transistor such that a base current provided by the DC-DC converter is reduced when the bipolar junction transistor enters saturation.

8. The system of claim 7 wherein the DC-DC converter is a buck-converter.

9. The system of claim 7 wherein the feedback from the collector of the bipolar junction transistor dynamically adjusts current provided by the DC-DC converter to the base of the bipolar transistor to maintain a determined voltage on the collector of the bipolar junction transistor.

10. A system having a bipolar junction transistor for driving a load and a base driver circuit coupled to drive a base of the bipolar junction transistor, wherein the base driver circuit comprises:
   A DC-DC converter coupled to drive a base of the bipolar junction transistor;
   A control circuit for providing pulses for controlling the DC-DC converter, the control circuit operable to enable the DC-DC converter to drive the base of the bipolar junction transistor when a control signal indicates the bipolar junction transistor is to be turned on, and operable to disable the DC-DC converter from driving the base of the bipolar junction transistor when the control signal indicates the bipolar junction transistor is to be turned off;

wherein the control circuit is provided with feedback from a collector of the bipolar junction transistor such that current provided by the DC-DC converter to the base of the bipolar junction transistor is dynamically adjusted to maintain a determined voltage on the collector of the bipolar junction transistor;

the system further comprising a base-turn-off transistor coupled to discharge charge stored in a base-emitter junction of the bipolar junction transistor, wherein the control circuit is operable to control the DC-DC converter to drive the bipolar junction transistor into deep saturation during a first interval of a bipolar junction transistor pulse, and is provided with feedback from a collector of the bipolar junction transistor such that current provided through the high-side switching device is dynamically adjusted to maintain a determined light-saturation voltage on the collector of the bipolar junction transistor during a second interval, and to drive the base-turn-off transistor to discharge charge stored in the base-emitter junction in a third interval.

\* \* \* \* \*